(12) United States Patent
Kan et al.

(10) Patent No.: US 10,601,386 B2
(45) Date of Patent: Mar. 24, 2020

(54) AUTOMATIC GAIN CONTROL CIRCUIT WITH BACKGROUND CALIBRATION

(71) Applicant: Rafael Microelectronics, Inc., Hsinchu County (TW)

(72) Inventors: Meng-Ping Kan, Hsinchu County (TW); Kuan-Ming Chen, Hsinchu County (TW); Benjamin Chiang, Hsinchu County (TW); Tzy-Yun Wang, Hsinchu County (TW)

(73) Assignee: Rafael Microelectronics, Inc., Hsinchu County (TW)

( * ) Notice: Subject to any disclaimer, the term of this patent is extended or adjusted under 35 U.S.C. 154(b) by 0 days.

(21) Appl. No.: 16/026,055

(22) Filed: Jul. 3, 2018

(65) Prior Publication Data

US 2020/0014353 A1    Jan. 9, 2020

(51) Int. Cl.
*H03G 3/30*      (2006.01)
*H03F 1/02*      (2006.01)
*H03M 1/18*      (2006.01)
*G01S 7/285*     (2006.01)

(52) U.S. Cl.
CPC .......... *H03G 3/3084* (2013.01); *G01S 7/285* (2013.01); *H03M 1/18* (2013.01)

(58) Field of Classification Search
USPC ......................................... 330/278, 254, 310
See application file for complete search history.

(56) References Cited

U.S. PATENT DOCUMENTS

| | | | |
|---|---|---|---|
| 6,498,927 B2* | 12/2002 | Kang | H03G 3/3068 330/133 |
| 10,200,002 B1* | 2/2019 | Youssef | H04B 1/109 |

* cited by examiner

*Primary Examiner* — Hieu P Nguyen
(74) *Attorney, Agent, or Firm* — Min-Lee Teng; Litron Patent & Trademark Office

(57) ABSTRACT

An automatic gain control circuit for controlling an LNA for inputting signals carrying packets, the automatic gain control circuit can perform a background calibration in the non-preamble time region of a first packet for pre-determining a gain adjustment to the LNA before the next preamble of a second packet arrives, so that the gain of the LNA can be adjusted immediately according to the pre-determined gain adjustment when the next preamble of the second packet arrives.

16 Claims, 4 Drawing Sheets

AUTOMATIC GAIN CONTROL CIRCUIT WITH BACKGROUND CALIBRATION

BACKGROUND OF THE INVENTION

1. Field of the Invention

The invention relates to RF receiver and, in particular, but not exclusively, to an automatic gain control circuit for controlling an amplifier for inputting signals carrying packets.

2. Description of the Prior Art

In wireless transmissions, when transmitting a packet, a preamble will be transmitted first for synchronization, and after the preamble is transmitted, row data of the packet will be transmitted. The preamble of the packet will be transmitted within a preamble time region. The purpose of the preamble is to establish bit synchronization and clock recovery first and then determine where the byte boundaries are located for decoding the row data of the packet.

An automatic gain control circuit is very important for controlling an input amplifier, such as an LNA, for inputting RF signals carry packets. The automatic gain control circuit can adjust the gain of the LNA in the preamble time region of the packet so that the voltage levels outputted from the LNA can be adjusted to be within a pre-determined range suitable for digitization. However, the RF signals inputted to the LNA may contain some unwanted signals having a large peak voltage level from time to time, and it takes time to allow the automatic gain control circuit to respond to such unwanted signals and adjust the gain of the LNA accordingly. Conventionally, the automatic gain control circuit adjusts the gain of the LNA by detecting the power level of the RF signals in the preamble time region of the packet, as a result, the automatic gain control circuit does not have sufficient time to respond to such unwanted signals that occur during the non-preamble time region of the packet.

Therefore, what is needed is a new way to design an automatic gain control circuit to overcome the above-mentioned issues.

SUMMARY OF THE INVENTION

One objective of present invention is to provide an automatic gain control for controlling an LNA for inputting signals carrying packets, wherein the automatic gain control circuit can perform a background calibration in the non-preamble time region of a first packet for pre-determining a gain adjustment to the LNA before the next preamble of a second packet arrives, so that the gain of the LNA can be adjusted immediately according to the pre-determined gain adjustment when the next preamble of the second packet arrives.

The present invention discloses an automatic gain control circuit, for controlling a first amplifier for inputting signals carrying packets, each packet comprising a preamble field within a preamble time region and a non-preamble field within a non-preamble time region, wherein said automatic gain control circuit comprises: a power detector coupled to the first amplifier to receive a first signal outputted from the first amplifier and to output a voltage level representing a power level of the first signal; and a second amplifier coupled to the power detector to adjust said voltage level outputted from the power detector, wherein a gain of the second amplifier is adjusted while in the current non-preamble time region such that the adjusted voltage level falls in a pre-determined range, so that a gain of the first amplifier is capable of being adjusted while in the next preamble time region immediately following the current non-preamble time region, according to the adjusted gain of the second amplifier.

In one embodiment, the first amplifier is an LNA (low-noise amplifier).

In one embodiment, the signals are RF signals.

In one embodiment, the power detector comprises an RMS voltage detector.

In one embodiment, the power detector comprises a peak voltage detector.

In one embodiment, the gain of the second amplifier is set to a fixed value without changing in the current preamble time region.

In one embodiment, the automatic gain control circuit further comprises a first comparator to compare the adjusted output level with a first reference voltage level and a second comparator to compare the adjusted output level with a second reference voltage level, for detecting whether the adjusted output level falls in the pre-determined range.

In one embodiment, the automatic gain control circuit further comprises a controller to control the gain of the first amplifier and the gain of the second amplifier according to the outputs of said comparators.

In one embodiment, the automatic gain control circuit further comprises an analog-to-digital converter coupled to the second amplifier to convert the adjusted output level into a digital value, for detecting whether the adjusted output level falls in the pre-determined range.

In one embodiment, the automatic gain control circuit further comprises a controller to control the gain of the first amplifier and the gain of the second amplifier according to the output of the analog-to-digital converter.

The present invention discloses a receiver with an automatic gain control, said receiver comprising: a first amplifier, for inputting signals carrying packets, each packet comprising a preamble field within a preamble time region and a non-preamble field within a non-preamble time region; a power detector, coupled to the first amplifier to receive a first signal outputted from the first amplifier and to output a voltage level representing a power level of the first signal; and a second amplifier, coupled to the power detector to adjust said voltage level outputted from the power detector, wherein a gain of the second amplifier is adjusted while in the current non-preamble time region such that the adjusted voltage level falls in a pre-determined range, so that a gain of the first amplifier is capable of being adjusted while in the next preamble time region immediately following the current non-preamble time region, according to the adjusted gain of the second amplifier.

The detailed technology and above preferred embodiments implemented for the present invention are described in the following paragraphs accompanying the appended drawings for people skilled in this field to well appreciate the features of the claimed invention.

BRIEF DESCRIPTION OF DRAWINGS

The foregoing aspects and many of the accompanying advantages of this invention will become more readily appreciated as the same becomes better understood by reference to the following detailed description when taken in conjunction with the accompanying drawings, wherein.

DETAILED DESCRIPTION OF EMBODIMENT

The detailed explanation of the present invention is described as following. The described preferred embodiments are presented for purposes of illustrations and description, and they are not intended to limit the scope of the present invention.

For receiving a packet, there are two time regions that can be defined, that is, a preamble time region in which a preamble is carried and a non-preamble time region in which data is carried. In some applications, such as IOT (Internet of Things) applications, the gain of the LNA can only be adjusted in the preamble time region, and then after the preamble time region, the remaining time region of the packet, the gain of the LNA gain needs to be fixed for extracting the data of the packet. While the gain of the LNA is adjusted in the preamble time region, the automatic gain control circuit of the present invention can perform a background calibration in the non-preamble time region for pre-determining a gain adjustment to the LNA before the next preamble arrives, so that the gain of the LNA can be adjusted immediately according to the pre-determined gain adjustment when the next preamble arrives. By doing so, the background calibration can continuously detect environment condition and adjusting the gain of an amplifier associated with the power detector for pre-determining a gain adjustment to the LNA before the next preamble arrives.

Figure 1:
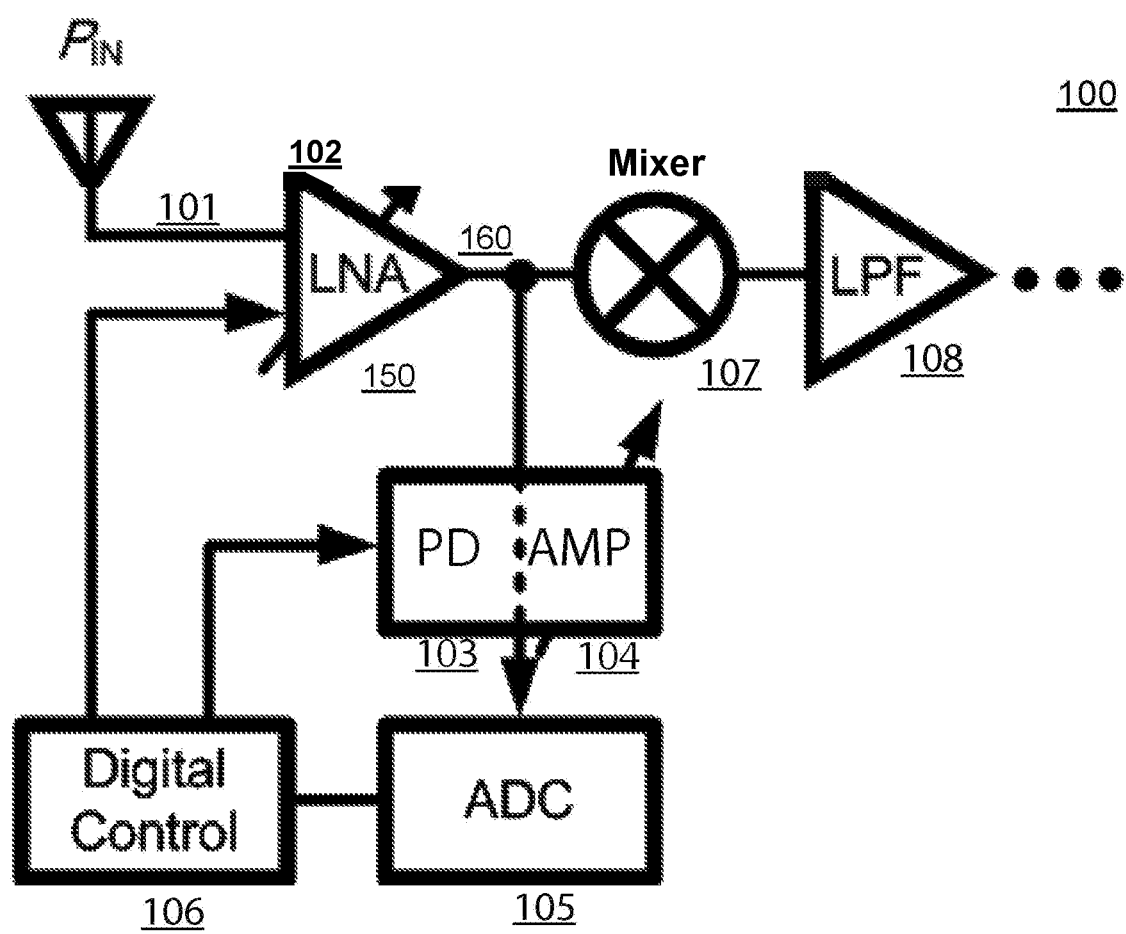
FIG. 1 illustrates an automatic gain control circuit in a receiver in accordance with one embodiment of the present invention.
Figure 2:
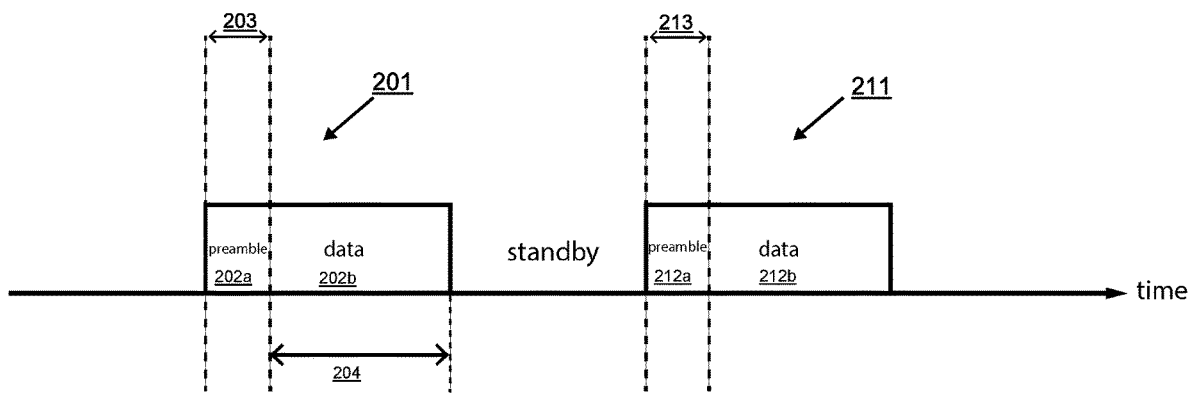
FIG. 2 illustrates times regions of packets received by the receiver in FIG. 1.

FIG. 1 illustrates an automatic gain control circuit 150 for controlling a first amplifier such as an LNA (Low-Noise Amplifier) 102 for inputting signals 101 carrying packets according to one embodiment of the present invention, as shown in FIG. 2, wherein a first packet 201 comprising a preamble field 202a carried in a preamble time region 203 and a data field 202b carried in a non-preamble time region 204 of the first packet 201; the first packet 201 is immediately followed by a second packet 211 that comprises a preamble field 212a carried in a preamble time region 213 and a data field 212b.

Please refer to FIG. 1 and FIG. 2. As shown in FIG. 1, the receiver 100 contains an automatic gain control circuit 150 for controlling the gain of an LNA (Low-Noise Amplifier) 102, wherein input signals 101 are inputted to the LNA 102. The automatic gain control circuit 150 comprises: a power detector 103 coupled to the output node 160 of the LNA 102 to receive a first signal presented at the output node 160 of the LNA 102 and to output a voltage level representing a power level of the first signal presented at the output node 160 of the LNA 102; and a second amplifier 104 coupled to the power detector 103 to adjust said voltage level outputted from the power detector 103, wherein a gain of the second amplifier 104 is adjusted while in a non-preamble time region 204 of a first packet 201 (see FIG. 2), such that the adjusted voltage level falls in a pre-determined range, so that a gain of the LNA 102 is capable of being adjusted while in the next preamble time region 213 of the second packet 211 (see FIG. 2) immediately following the current non-preamble time region 204, according to the adjusted gain of the second amplifier 104.

In one embodiment, the automatic gain control circuit 150 further comprises an analog-to-digital converter 105 coupled to the second amplifier 104 to convert the adjusted output level into a digital value, for detecting whether the adjusted output level falls in the pre-determined range.

In one embodiment, the automatic gain control circuit 150 further comprises a controller 106 to control the gain of the LNA 102 and the gain of the second amplifier 104 according to the output of the analog-to-digital converter 105.

In one embodiment, the gain of the second amplifier 104 is set to a fixed value in current preamble time region 203 (see FIG. 2).

In one embodiment, the power detector comprises a peak voltage detector.

In one embodiment, the power detector comprises an RMS voltage detector.

Figure 3:
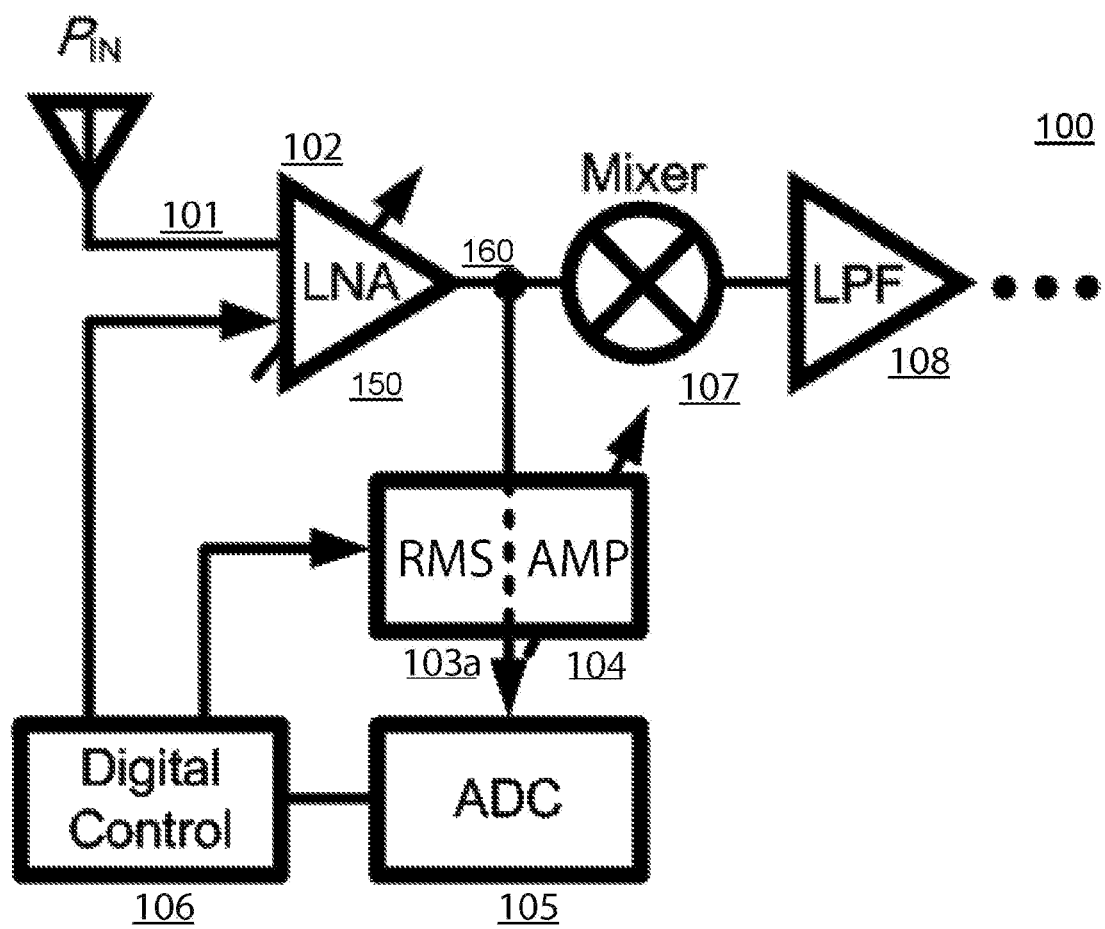
FIG. 3 illustrates an example of the automatic gain control circuit in FIG. 1.

As shown in FIG. 3, the automatic gain control circuit 150 comprises: an RMS voltage detector 103a coupled to the LNA 102 to receive a first signal presented at the output node 160 of the LNA 102 and to output a voltage level representing a power level of the first signal presented at the output node 160 of the LNA 102; and a second amplifier 104 coupled to the RMS voltage detector 103a to adjust said voltage level outputted from the RMS voltage detector 103a, wherein a gain of the second amplifier 104 is adjusted while in a non-preamble time region 204 of a first packet 201 (see FIG. 2), such that the adjusted voltage level falls in a pre-determined range, so that a gain of the LNA 102 is capable of being adjusted while in the next preamble time region 213 of the second packet 211 (see FIG. 2) immediately following the current non-preamble time region 204, according to the adjusted gain of the second amplifier 104.

In one embodiment, the automatic gain control circuit 150 comprises voltage comparators (not shown) for detecting whether the adjusted output level falls in the pre-determined range, and the analog-to-digital converter 105 (in FIG. 1 and FIG. 3) are replaced by the voltage comparators, wherein a first comparator is used to compare the adjusted output level with a first reference voltage level and a second comparator is used to compare the adjusted output level with a second reference voltage level, for detecting whether the adjusted output level falls in the pre-determined range.

Figure 4:
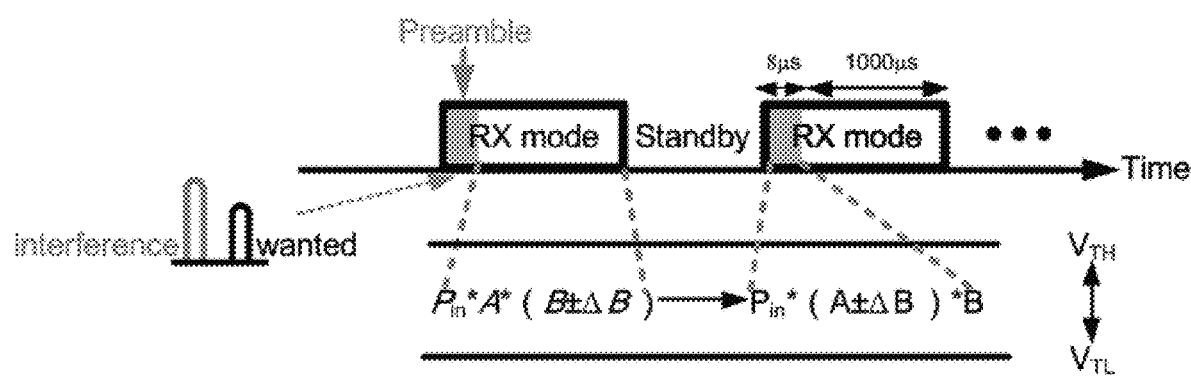
FIG. 4 illustrates an example of the operation of the automatic gain control circuit of FIG. 1 in accordance with one embodiment of the present invention.

Please refer to FIG. 1 and FIG. 4. As shown in FIG. 4, the gain of the LNA 102 has been set to a value A in the current the preamble region, and the gain of the second amplifier 104 is set to a pre-defined value B in the current the preamble region. In the non-preamble time region, Pin*A*B will be kept in a pre-determined range to ensure the LNA 102 is operating in a suitable condition, wherein Pin represents the power level of the input signal 101 in FIG. 1. When Pin*A*B is not in the pre-determined range (as shown as $V_{TH}$ to $V_{TL}$ in FIG. 4) while in the non-preamble time region, the gain of the second amplifier 104 will be adjusted by the amount of $\Delta B$ in order to allow Pin*A*(B+$\Delta B$) (as shown in FIG. 4) falls in the pre-determined range. Then, the gain of the LNA 102 can be adjusted according to the amount of $\Delta B$ when the next preamble region arrives. For example, when the LNA receives an interference signal that has a larger power level, the gain of the second amplifier 104 can be reduced by the amount of $\Delta B$ in the non-preamble time region for keeping Pin*A*(B−$\Delta B$) in the pre-determined range, and the automatic gain control circuit 150 of the present invention can reduce the gain of the LNA according to the amount of $\Delta B$ when the next preamble region arrives, for example, the gain of the LNA can be set as A−ΔB and the gain of the second amplifier 104 is set back to the pre-defined value B when the next preamble region arrives. Typically, the preamble time region of a packet lasts about 8us and the non-preamble time region of a packet lasts about 1000 us. If we can take advantage of 1000 us to do a background calibration to pre-determine a suitable gain adjustment of the LAN 102 in the non-preamble time region, the gain of the LNA 102 can be set according to the suitable gain adjustment when the next preamble time region arrives, so as to converge the gain of the LNA quickly in the preamble time regions of packets, so that the LNA 102 can provide a good quality signal to the circuits including a Mixer 107 and a low pass filter 108 as shown in FIG. 1 and FIG. 3.

The foregoing descriptions of specific embodiments of the present invention have been presented for purposes of illustrations and description. They are not intended to be exclusive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to particular use contemplated. It is intended that the scope of the invention be defined by the claims appended hereto and their equivalents.

What is claimed is:

1. An automatic gain control circuit, for controlling a first amplifier for inputting signals carrying packets, each packet comprising a preamble field within a preamble time region and a non-preamble field within a non-preamble time region, wherein a mixer is coupled to the first amplifier to receive outputted signals of the first amplifier, wherein said automatic gain control circuit comprises: a power detector for receiving a first signal outputted from the first amplifier and to output a voltage level representing a power level of the first signal, wherein the power detector is coupled to the first amplifier to receive the first signal via a conductive path that does not include said mixer; and a second amplifier coupled to the power detector to adjust said voltage level outputted from the power detector, wherein the second amplifier is coupled to the power detector to receive said voltage level via a conductive path that does not include said mixer and a gain of the second amplifier is adjusted while in the current non-preamble time region such that the adjusted voltage level falls in a pre-determined range, so that a gain of the first amplifier is capable of being adjusted while in the next preamble time region immediately following the current non-preamble time region, according to the adjusted gain of the second amplifier.

2. The automatic gain control circuit as recited in claim 1, wherein the first amplifier is an LNA (low-noise amplifier).

3. The automatic gain control circuit as recited in claim 2, wherein the signals inputted to the first amplifier are RF signals.

4. The automatic gain control circuit as recited in claim 1, wherein the power detector comprises an RMS voltage detector.

5. The automatic gain control circuit as recited in claim 1, wherein power detector comprises a peak voltage detector.

6. The automatic gain control circuit as recited in claim 1, wherein the gain of the second amplifier is set to a fixed value without changing in the current preamble time region.

7. The automatic gain control circuit as recited in claim 1, further comprising an analog-to-digital converter coupled to the second amplifier to convert the adjusted output level into a digital value, for detecting whether the adjusted output level falls in the pre-determined range.

8. The automatic gain control circuit as recited in claim 7, further comprising a controller to control the gain of the first amplifier and the gain of the second amplifier according to the output of the analog-to-digital converter.

9. The automatic gain control circuit as recited in claim 1, wherein the automatic gain control circuit is used in an IOT (Internet of Things) application.

10. A receiver with an automatic gain control, said receiver comprising:
a first amplifier, for inputting signals carrying packets, each packet comprising a preamble field within a preamble time region and a non-preamble field within a non-preamble time region, wherein a mixer is coupled to the first amplifier to receive outputted signals of the first amplifier;
a power detector, for receiving a first signal outputted from the first amplifier and to output a voltage level representing a power level of the first signal, wherein the power detector is coupled to the first amplifier to receive the first signal via a conductive path that does not include said mixer; and
a second amplifier, coupled to the power detector to adjust said voltage level outputted from the power detector, wherein the second amplifier is coupled to the power detector to receive said voltage level via a conductive path that does not include said mixer and a gain of the second amplifier is adjusted while in the current non-preamble time region such that the adjusted voltage level falls in a pre-determined range, so that a gain of the first amplifier is capable of being adjusted while in the next preamble time region immediately following the current non-preamble time region, according to the adjusted gain of the second amplifier.

11. The receiver with an automatic gain control as recited in claim 10, wherein the first amplifier is an LNA (low-noise amplifier).

12. The receiver with an automatic gain control as recited in claim 10, wherein the signals inputted to the first amplifier are RF signals.

13. The receiver with an automatic gain control as recited in claim 10, wherein the power detector comprises an RMS voltage detector.

14. The receiver with an automatic gain control as recited in claim 10, wherein the receiver is used in an IOT (Internet of Things) application.

15. The receiver with an automatic gain control as recited in claim 10, further comprising an analog-to-digital converter coupled to the second amplifier to convert the adjusted output level into a digital value, for detecting whether the adjusted output level falls in the pre-determined range.

16. The receiver with an automatic gain control as recited in claim 15, further comprising a controller to control the gain of the first amplifier and the gain of the second amplifier according to the output of the analog-to-digital converter.

* * * * *